United States Patent [19]
Shen et al.

[11] Patent Number: 6,144,100
[45] Date of Patent: Nov. 7, 2000

[54] INTEGRATED CIRCUIT WITH BONDING LAYER OVER ACTIVE CIRCUITRY

[75] Inventors: Chi-Cheong Shen, Richardson, Tex.; Donald C. Abbott, Norton, Mass.; Walter Bucksch, Freising, Germany; Marco Corsi, Plano, Tex.; Taylor Rice Efland, Richardson, Tex.; John P. Erdeljac, Plano, Tex.; Louis Nicholas Hutter, Richardson, Tex.; Quang Mai, Sugarland, Tex.; Konrad Wagensohner, Mauern, Germany; Charles Edward Williams, Dallas, Tex.

[73] Assignee: Texas Instruments Incorporated, Dallas, Tex.

[21] Appl. No.: 08/959,410

[22] Filed: Oct. 28, 1997

[51] Int. Cl.[7] .............................. H01L 23/48; H01L 23/52

[52] U.S. Cl. ........................ 257/762; 257/766; 257/768

[58] Field of Search ................................. 257/762, 766, 257/768

[56] References Cited

U.S. PATENT DOCUMENTS

| 5,182,420 | 1/1993 | Steitz et al. | 257/751 |
| 5,367,195 | 11/1994 | Digiacomo et al. | 257/767 |
| 5,369,220 | 11/1994 | Harada et al. | 257/767 |
| 5,734,200 | 3/1998 | Hsue et al. | 257/767 |

*Primary Examiner*—Leo P. Picard
*Assistant Examiner*—Hung Van Duong
*Attorney, Agent, or Firm*—Wade James Brady, III; Frederick J. Telecky, Jr.

[57] ABSTRACT

An integrated circuit device (10) with a bonding surface (12) directly over its active circuitry, and a method of making such integrated circuits (FIGS. 2A 2E). To make the bonding surface (12), a wafer (20) is provided with vias (24) to its metallization layer (21) and then coated with a seed metal layer (25). A plating pattern (26) is formed on the wafer (20), exposing portions of the seed metal layer (25) and blocking the rest of the seed metal layer (25). These exposed portions are plated with successive metal layers (27, 28, 29), thereby forming a bonding surface (12) having a number of layered stacks (200) that fill the vias (24). The plating pattern and the nonplated portions of the seed metal layer (25) are then removed.

17 Claims, 3 Drawing Sheets

6,144,100

INTEGRATED CIRCUIT WITH BONDING LAYER OVER ACTIVE CIRCUITRY

TECHNICAL FIELD OF THE INVENTION

The present invention relates generally to integrated circuits (IC's), and more particularly to IC's having a bonding surface that permits bond pads to be fabricated on top of the IC's active circuitry rather than in the IC's periphery.

BACKGROUND OF THE INVENTION

Electronic devices made using semiconductor fabrication techniques (silicon integrated circuits), use bond pads for bonding electrical connecting wires to the device. Typically, the bond pads, as well as their buses, are placed in the periphery of the integrated circuit (IC), outside the area containing active components. This conventional structure for the bond pads adds to the required real estate of the IC, which reduces production efficiency and increases the size of each IC. It also adds resistance to the current path and limits the bond pitch.

SUMMARY OF THE INVENTION

One aspect of the invention is a method of fabricating a bonding surface on a wafer from which integrated circuits (IC's) will be made. It is assumed that the wafer has at least a metallization layer for its active circuitry. A protective coating is deposited over the metallization layer. Vias are etched or otherwise formed through the protective coating to the metallization layer. A seed metal layer is then deposited over the entire surface of the wafer. A plating pattern, such as a photoresist pattern, is defined over the seed metal layer, resulting in exposed portions of the seed metal layer (vias) where connections are to be made to the metallization layer. A series of plating layers are then formed, with the plating material filling the vias and forming a desired pattern on the surface of the wafer. Specifically, the plating layers comprise at least a support layer then a wire bonding layer. At each via, the seed metal layer, the support layer, and the wire bonding layer form a "connector stack" that electrically connects the plating layer to the metallization layer. Finally, the seed metal layer, where it has not been plated, is removed. The plating layer forms a bonding surface for wire bonding for purposes of external electrical connections to the IC.

An advantage of the invention is that it permits bond pads to be fabricated directly over the active circuitry of an IC, rather than next to the active circuitry in the IC's periphery. As a result, the area of the IC is reduced. Also, the ability to perform wire bonding directly over the active circuitry relaxes bond pitch constraints and reduces interconnect parasitic resistance.

The plated bonding surface permits either aluminum or gold or even mixed aluminum and gold wire bonding. At the same time, the bonding surface protect the underlying active circuitry from damage during the bonding process.

DETAILED DESCRIPTION OF THE INVENTION

Figure 1:
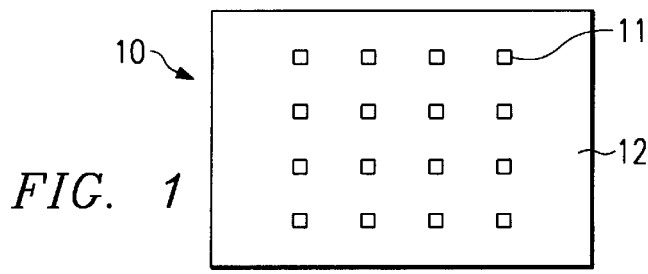
FIG. 1 illustrates an integrated circuit having a plated bonding surface in accordance with the invention.

FIG. 1 illustrates an integrated circuit (IC) 10, having bond pads 11 and a bonding surface 12 in accordance with the invention. The IC's active circuitry is under the bonding surface 12. Thus, the bond pads 11 are located over the active circuitry, rather than next to the active circuitry in peripheral areas of the IC. By "active circuitry" is meant the various electrical components that provide functionality to the IC 10. Although not explicitly illustrated in FIG. 1, the bonding surface 12 is actually a pattern of conductive circuitry, as desired to interconnect various locations on an underlying metallization layer to bond pads 11. As explained below, each bond pad 11 is connected to the active circuitry's metallization layer by means of the bonding surface 12, which fills vias to the metallization layer with stacks of electrically conductive materials.

FIGS. 2A–2E illustrate a method of manufacturing IC 10. More specifically, FIGS. 2A–2E illustrate a portion of a wafer 20 from which IC 10 will be cut, in various steps of the manufacturing process relevant to the invention.

Figure 2A:
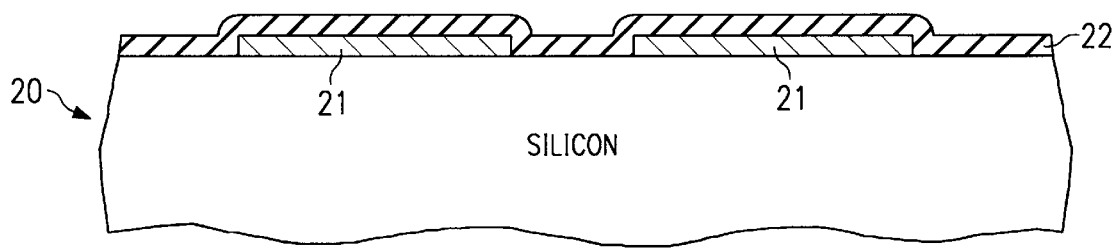
FIGS. 2A–2E illustrate a process of fabricating the bonding surface of FIG. 1.

In FIG. 2A, the method of the invention begins with a wafer 20 that is already in a partially manufactured state. A metallization layer 21 that will become part of each IC's active circuitry has been deposited and etched. In the example of this description, only a single metallization layer 21 is shown, but wafer 20 may have additional metallization layers. Typically, metallization layer 21 is aluminum.

A protective overcoat layer 22 has been deposited on the surface of wafer 20. This layer 22 uniformly covers the metallization layer 21. Overcoat layer 22 is made from an electrically nonconductive material, which is suitable for protecting metallization layer 21 during subsequent fabrication. Examples of suitable materials are silicon nitride or a nitride/oxide combination. A typical thickness of overcoat layer 22 is 1 micron.

Figure 2B:
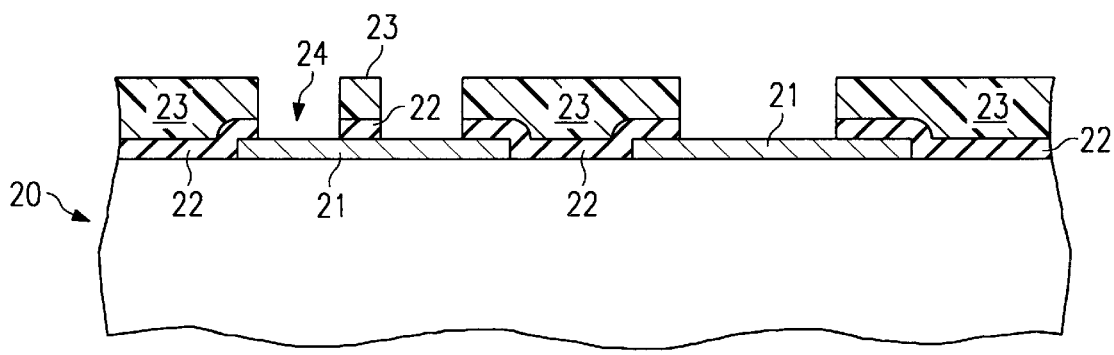

In FIG. 2B, vias 24 have been formed through the overcoat layer 22 to the metallization layer 21. In the example of this description, the vias 24 are formed by depositing a photoresist layer 23 over the overcoat layer 22. This photoresist layer 23 has been exposed and developed, leaving a desired pattern, and overcoat layer 22 has been etched according to this pattern. The patterning and etching result in the vias 24, and thus the blocking photoresist pattern of FIG. 2B is referred to herein as a "via pattern".

Figure 2C:
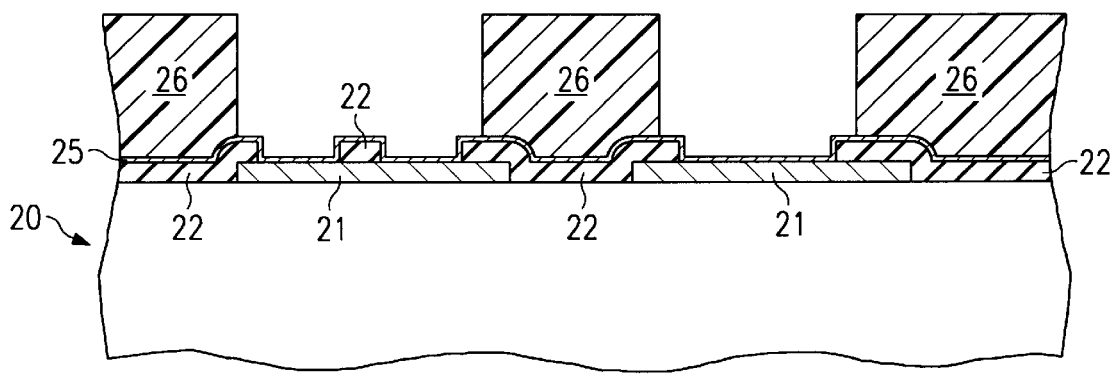

In FIG. 2C, the photoresist material remaining from photoresist layer 23 has been removed. A seed metal layer 25 has been deposited over the surface of wafer 20. The seed metal layer 25 may be any conductive metal, but as explained below, its desired characteristic is that it provides a continuous adhesive and conductive layer that permits exposed portions of its upper surface to be electroplated. Seed metal layer 25 is thin, for example, having a range of thicknesses from 0.1–0.3 microns. In general, as will become evident from the following discussion of FIGS. 2D and 2E, seed metal layer 25 is sufficiently thick to permit exposed portions to be electroplated but sufficiently thin to subsequently permit fast etching of portions that are not plated. The deposition of seed metal layer 25 may be by any means appropriate for the material and desired thickness.

In the example of this description, seed metal layer 25 is actually two layers—a first "barrier" layer and a second "plating" layer. Examples of suitable materials for the first layer are titanium or a titanium tungsten alloy. These materials have the desired characteristics of promoting adhesion to the metallization and overcoat layers and of preventing migration of subsequent copper material to the metallization layer 21. An example of a suitable material for the second layer is copper. Other materials that provide a suitable surface for electroplating additional copper could alternatively be used for the second layer. A typical thickness might be 0.3 microns for the first layer and 0.2 microns for the second layer. Alternatively, seed metal layer 25 could be a single layer, with appropriate measures being taken to ensure that it may be successfully plated without undue migration.

Over seed metal layer 25, a blocking plating pattern has been formed. In the example of this description, this is accomplished by patterned photoresist layer 26. As a result of the patterning of layer 26, portions of the seed metal layer 25 are exposed on the surface of wafer 20. It is possible that materials other than photoresist could be used for defining the plating pattern.

Figure 2D:
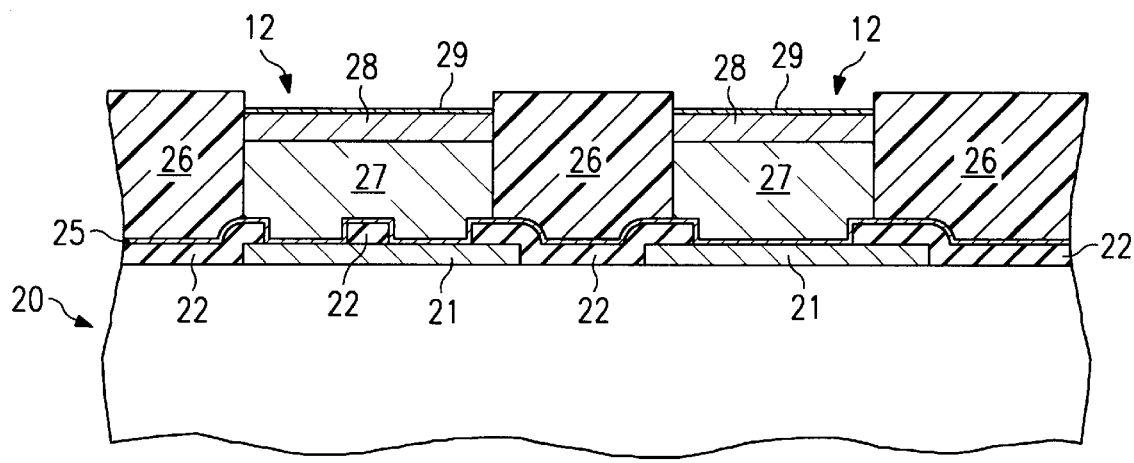

In FIG. 2D, the plating pattern has been used to confine the plating of several metal layers 27, 28, and 29 to the exposed portions of seed metal layer 25. Because seed metal layer 25 is continuous over the surface of wafer 20, its exposed surfaces will receive material deposited by means of electroplating. These metal layers 27, 28, 29 form a number of composite "connector stacks" 200 on wafer 20.

The first layer 27 of each connector stack 200 is a thick "support layer" of bond pads 11. In the example of this description, the first layer 27 is a thick layer of copper. This layer 27 is approximately 10 to 30 microns thick. Other materials could be suitable, so long as they provide the desired characteristics of layer 27, that is, mechanical protection of the active circuitry and good electrical conduction.

The next two layers 28 and 29 are the wire bonding layers. The second layer 28 is a wire bonding substrate, for example, of nickel. Other materials could be suitable, with the desired characteristic being the provision of a layer suitable for bonding to electrical connections. These connections are typically aluminum or gold wires, so that layer 28 is typically suitable for bonding to those materials. Layer 28 is approximately 1 to 2 microns thick. A third layer 29 is a sacrificial layer that prevents oxidation of the wire bonding substrate layer 28. Examples of suitable materials for layer 29 are palladium and gold. Layer 29 is approximately 0.02 to 0.1 microns thick. As an alternative to two layers 28 and 29, it is possible that a single wire bonding layer of a suitable material could be used.

The plating pattern may form any desired pattern on the surface of wafer 20 resulting in the patterned bonding surface 12. Thus, a single connector stack 200 could fill multiple vias or only a single via, as shown in FIG. 2D. Also, as explained below in connection with FIG. 4, the plating pattern may spread out from the stacks, across the surface of wafer 20

Figure 2E:
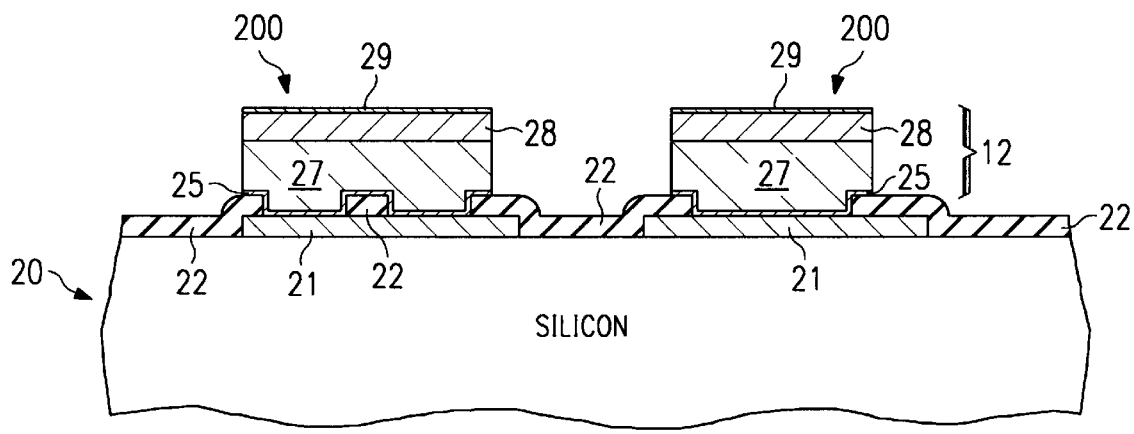

FIG. 2E illustrates the removal of the remaining photoresist of the plating pattern layer 26. This exposes the portions of the seed metal layer 25 that were not plated. These nonplated portions of the seed metal layer 25 are also removed, such as by etching.

The result of the removal of the nonplated portions of the seed metal layer 25 is the electrical isolation of stacks 200. Each stack 200 contacts the metallization layer 21 at a desired location and is otherwise insulated from wafer 20 by the overcoat layer 22.

Figure 3A:
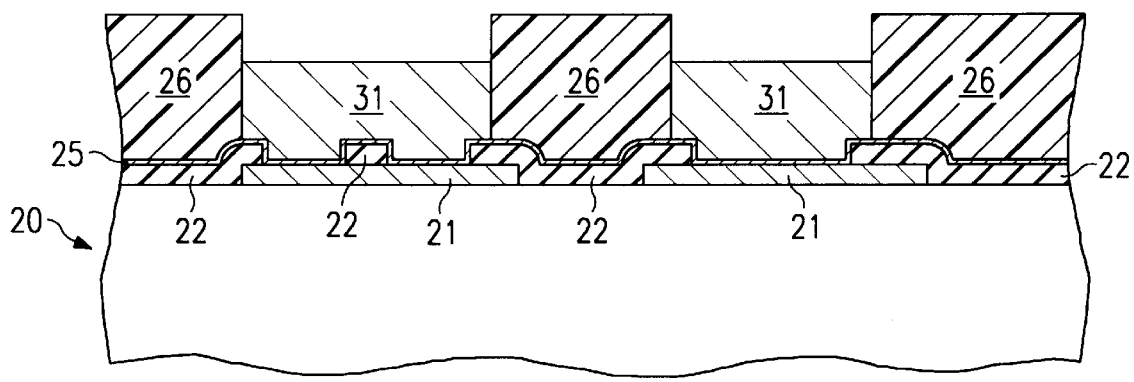
FIGS. 3A–3C illustrate an alternative method of the invention.
Figure 3B:
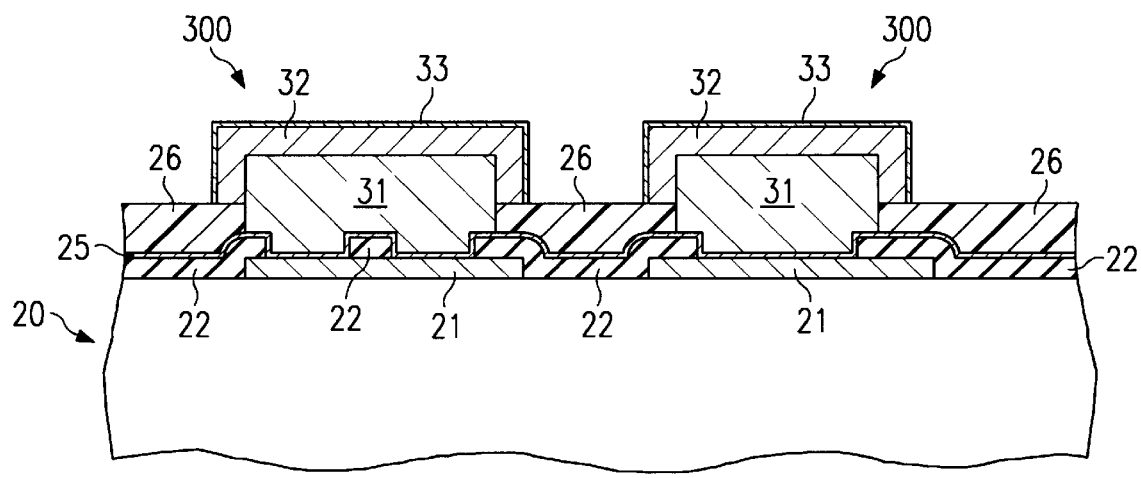
Figure 3C:
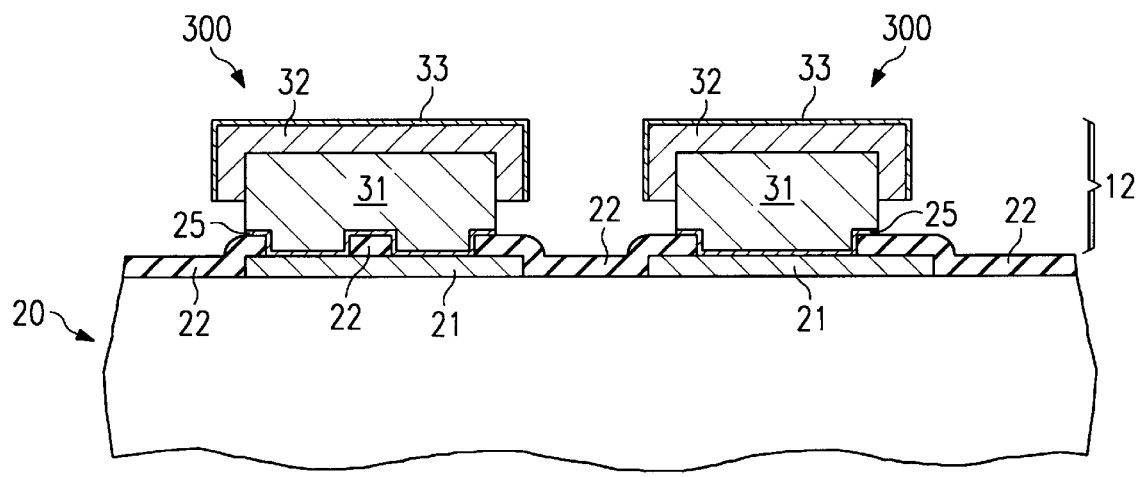

FIGS. 3A–3C illustrate an alternative method of fabricating a bonding layer in accordance with the invention. Up to the steps illustrated in FIG. 3A, the process is the same as that described above in connection with FIGS. 2A–2C.

Wafer 20 has a seed metal layer 25 and a photoresist layer 26, which the latter having been patterned to define a plating pattern. In FIG. 3A, a support layer 31 has been electroplated on the portions of seed metal layer 25 that are exposed by the plating pattern. Layer 31 is part of what will be the bonding layer, which has conductive stacks similar to stacks 200 but with side plating. Layer 31 has the same characteristics as layer 27 of the embodiment of FIGS. 2A–2E, and may be, for example a layer of copper 10 to 30 microns thick.

In FIG. 3B, the photoresist layer 26 has been partially removed to a desired thickness, which exposes the sides of the copper support layer 31. Next, layer 31 has been plated with a wire bonding substrate layer 32, which has the same characteristics as layer 28. Finally, a sacrificial layer 33 is plated, or otherwise deposited, with this layer 33 having the same characteristics as layer 29.

In FIG. 3C, the photoresist layer 26 and the exposed surfaces of seed metal layer 25 have been removed. The removal of the exposed seed metal layer 25 results in electrical isolation of stacks 300. The plated side of stacks 300 protect the support layer 31 from environmental degradation and from degradation especially during removal of layers 26 and 25. Because layer 31 is protected during removal of layer 25, the requirement that layer 25 be thin is more relaxed as compared to the embodiment of FIGS. 2A–2E.

Figure 4:
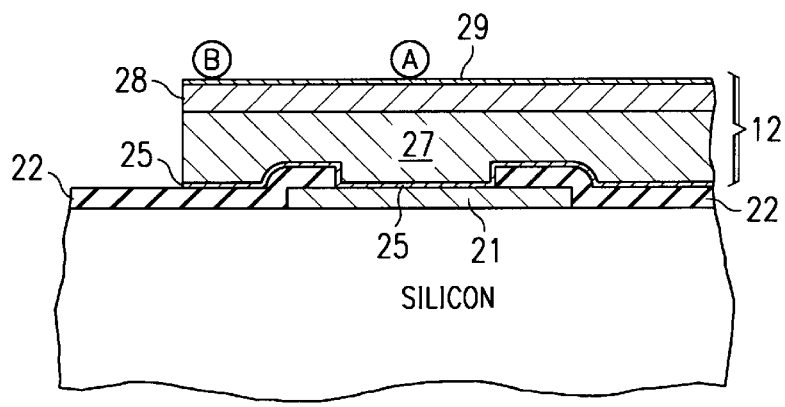
FIG. 4 is a cross-sectional view of the bonding surface.

FIG. 4 is a cross sectional view of the IC 10 of FIG. 1. A single stack, such as stack 200 or 300 is shown. The stack is part of the bonding layer 12 and fills a via 24 to the metallization layer 21. As indicated, the bonding may occur anywhere on the surface of the bonding layer, and need not be directly over the stack. Thus, the bonding could be at location "A", directly over the via, or location "B", elsewhere on the bonding surface. The entire bonding surface 12 is amenable to wire bonding, such as with gold or aluminum wire.

For each stack 200, the thick copper layer 27 of the stacks provides good conduction and a stable bonding platform, as well as shields active circuitry of the IC from bond damage. The nickel layer 28 and the palladium (or gold) layer 29 provide a wire bondable surface and permit capping of the copper. These features are also true for stack 300 and its bonding layers 31, 32, and 33.

Other Embodiments

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An integrated circuit device, comprising:

a silicon substrate;

an active circuit fabricated in said substrate comprised of electrical components;

a metallization layer formed over said active circuit; and an electrically conductive bonding surface positioned directly over said active circuit, said bonding surface having connector stacks that fill vias to said metallization layer, each of said stacks being comprised of a stack of the following electrically conductive layers in succession: a seed metal layer in contact with said metallization layer, a metal support layer in contact with said seed metal layer, and at least one metal wire bonding layer in contact with said metal support layer.

2. The integrated circuit device of claim 1, wherein said seed metal layer is at least in part comprised of titanium.

3. The integrated circuit device of claim 1, wherein said metal support layer is comprised at least in part of copper.

4. The integrated circuit device of claim 1, wherein said metal wire bonding layer is comprised at least in part of nickel.

5. The integrated circuit device of claim 1, wherein said metal wire bonding layer is comprised at least in part of palladium.

6. The integrated circuit device of claim 1, wherein said wire bonding layer is comprised of a first layer of nickel in contact with said metal support layer and a second layer of palladium in contact with said first layer of nickel.

7. The integrated circuit device of claim 1, wherein said metal support layer has a top surface and a pair of side surfaces, said metal wire bonding layer covering said top surface and at least a portion of the side surfaces of said metal support layer.

8. The integrated circuit device of claim 1, wherein said integrated circuit further comprises an electrically non-conductive protective layer over a portion of said metallization layer and between said stacks.

9. The integrated circuit device of claim 1, wherein said metal support layer is copper having a thickness in the range of 10–30 microns.

10. The integrated circuit device of claim 1, wherein said metal seed layer includes a first barrier metal layer in contact with said metallization layer and a second plating metal layer in contact with said first barrier metal layer.

11. The integrated circuit device of claim 1, wherein said wire bonding layer is comprised of a first layer of nickel and a second layer of gold in contact with said first layer of nickel.

12. The integrated circuit device of claim 1, wherein said bonding surface for at least one of said connector stacks includes a first portion directly over said metallization layer and a second portion laterally spaced from said first portion and said metallization layer.

13. The integrated circuit device of claim 6, wherein said first layer of nickel has a thickness in the range of 1–2 microns and said second layer of palladium has a thickness in the range of 0.02–0.1 microns thick.

14. The integrated circuit device of claim 10, wherein said first barrier metal is comprised at least in part of titanium and said second plating metal layer is comprised at least in part of copper.

15. The integrated circuit device of claim 11, wherein said first layer of nickel has a thickness in the range of 1–2 microns and said second layer of gold has a thickness in the range of 0.02–0.1 microns thick.

16. The integrated circuit device of claim 12, further comprising a wire bond formed on said first portion.

17. The integrated circuit device of claim 12, further comprising a wire bond formed on said second portion.

* * * * *

UNITED STATES PATENT AND TRADEMARK OFFICE
CERTIFICATE OF CORRECTION

PATENT NO.    : 6,144,100
DATED         : Nov. 7, 2000
INVENTOR(S)   : Shen et al.

Page 1 of 1

It is certified that error appears in the above-identified patent and that said Letters Patent is hereby corrected as shown below:

On the left column of the cover sheet under "Filed: Oct. 28, 1997" insert: --Related U.S. Application Data Provisional Application No. 60/048,734 filed June 5, 1997,--

Column 1, after line 3, insert: --This application claims priority under 35 U.S.C. § 119 (e)(1) of Provisional Application Number 60/048,734 filed 06/05/97.--

Signed and Sealed this

Fifth Day of June, 2001

*Attest:*

*Attesting Officer*

NICHOLAS P. GODICI

*Acting Director of the United States Patent and Trademark Office*